(12) United States Patent
Seo et al.

(10) Patent No.: US 7,920,417 B2
(45) Date of Patent: Apr. 5, 2011

(54) SEMICONDUCTOR MEMORY DEVICE

(75) Inventors: Woo-Hyun Seo, Gyeonggi-do (KR);
Kwang-Myoung Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 86 days.

(21) Appl. No.: 12/494,344

(22) Filed: Jun. 30, 2009

(65) Prior Publication Data
US 2010/0290280 A1 Nov. 18, 2010

(30) Foreign Application Priority Data

May 13, 2009 (KR) .................. 10-2009-0041587

(51) Int. Cl.
*G11C 11/14* (2006.01)
(52) U.S. Cl. ................ 365/171; 365/189.09; 365/210.1; 365/211
(58) Field of Classification Search ............. 365/210.11, 365/211
See application file for complete search history.

(56) References Cited

U.S. PATENT DOCUMENTS

| 6,307,797 | B1 * | 10/2001 | Fournel et al. ........... 365/189.09 |
| 6,775,186 | B1 * | 8/2004 | Eshel ..................... 365/185.21 |
| 6,807,101 | B2 * | 10/2004 | Ooishi et al. ............. 365/185.21 |
| 7,027,325 | B2 * | 4/2006 | Iwata ...................... 365/158 |
| 7,200,042 | B2 * | 4/2007 | Drebinger ................ 365/185.2 |
| 7,212,443 | B2 * | 5/2007 | Furuyama ............... 365/185.18 |
| 7,359,254 | B2 * | 4/2008 | Takeda .................... 365/189.09 |
| 7,773,445 | B2 * | 8/2010 | Pagano et al. ........... 365/210.12 |

FOREIGN PATENT DOCUMENTS
KR 1020030045639 6/2003

OTHER PUBLICATIONS

Notice of Preliminary Rejection issued from Korean Intellectual Property Office on Nov. 29, 2011.

* cited by examiner

*Primary Examiner* — Tan T. Nguyen
(74) *Attorney, Agent, or Firm* — IP & T Group LLP

(57) ABSTRACT

A semiconductor memory cell includes a plurality of memory cells configured to store data having polarity corresponding to a direction of current flowing in first and second driving lines, a current generator configured to generate a predetermined read current, apply the predetermined read current to the plurality of memory cells, and generate a data current corresponding variation of the read current according to the data and a current controller connected to a current path of the read current and configured to control a current amount of the read current.

15 Claims, 3 Drawing Sheets

SEMICONDUCTOR MEMORY DEVICE

CROSS-REFERENCE TO RELATED APPLICATIONS

The present invention claims priority of Korean Patent Application No. 10-2009-0041587, filed on May 13, 2009, which is incorporated herein by reference in its entirety.

BACKGROUND OF THE INVENTION

The present invention relates to a semiconductor design technology, and more particularly, to a semiconductor memory device using a magnetic tunnel junction device (MTJ).

In general, a dynamic random access memory (DRAM) device and a static random access memory (SRAM) device are a volatile memory device that loses data stored in a memory cell when power is not applied thereto. Therefore, many researches have been made to develop a non-volatile memory device. Among newly developed memory devices, a magnetic random access memory (MRAM) has been receiving attention as the next generation semiconductor device because the MRAM device not only has non-volatile characteristics but also has high integration, high speed operation, and low power consumption characteristics.

A memory cell of the MRAM device includes a transistor for performing a switching operation corresponding to an address applied from an external device and a magnetic tunnel junction device (MTJ) for storing information. The magnetic tunnel junction device (MTJ) is a kind of a magnetic memory device and has a magnet-to-resistance (MR) ratio that varies according to a magnetization direction of two ferromagnets. The MRAM device determines whether data stored in the magnetic tunnel junction device is '1' or '0' by sensing current according to the variation of the MR ratio.

FIG. 1 is a diagram illustrating a memory cell of a semiconductor memory device according to the prior art.

Referring to FIG. 1, the memory cell includes a NMOS transistor 110 and a MTJ device 130.

The NMOS transistor 110 includes a source-drain path formed between a source line SL and the MTJ device 130 and a gate connected to a word line WL. Such a NMOS transistor 110 is turned on/off according to activation of the word line WL. The world line is selected by a row address.

The MTJ device 130 includes a free layer 132, a tunnel insulating layer 134, and a pinned layer 136. The free layer 132 is formed of ferromagnetic substance and has a magnetization direction varying according to external stimulation, for example, current penetrating the MTJ 130. The pinned layer 136 has a magnetization direction that is not changed although an external stimulation is applied thereof. Particularly, the pinned layer 136 has a magnetization direction fixed by a pinning layer (not shown) formed of antiferromagentic, and the tunnel insulating layer 134 may be formed of magnesium oxide MgO.

Tunneling current flows in the magnetic tunnel junction device 130 according to a voltage applied to the both ends thereof. When the magnetization direction of the free layer 132 is matched with the magnetization direction of the pinned layer 136, the resistance value of the magnetic tunnel junction device 130 becomes small. When the magnetization direction of the free layer 132 is not matched with the magnetization direction of the pinned layer 136, the resistance value of the magnetic tunnel junction device 130 becomes large. In general, if the magnetization direction of the free layer 132 is identical to that of the pinned layer 136, the magnetic tunnel junction denotes denotes '1'. If not, the magnetic tunnel junction denotes '0'.

In other word, when positive current higher than a threshold current flows into the free layer 132 by applying a positive voltage to the free layer 132, which is a predetermined level higher than that applied to the pinned layer 136, the magnetization directions of the free layer 132 and the pinned layer 136 become identical. That is, a write operation for writing '0' is performed and a resistance value of the magnetic tunnel junction device 130 becomes small. On the contrary, when negative current higher than a threshold current flows into the free layer 132 by applying a negative voltage to the free layer 132, which is a predetermined level higher than that of the pinned layer 136, the magnetization directions of the free layer 132 and the pinned layer 136 become opposite. That is, a write operation for writing '1' is performed and a resistance value of the magnetic tunnel junction device 130 becomes large.

FIG. 2 is a graph showing tunnel magnet-to-resistance (TMR) characteristics according to a temperature of a magnetic tunnel junction device 130 of FIG. 1.

As shown in FIG. 2, the magnetic tunnel junction device 130 has hysteresis and two stable states according to a positive current or a negative current higher than a threshold voltage, that is, a state having small resistance value and a state having a large resistance value. The stable states are continuously sustained although the power is not applied.

As shown in FIG. 2, the magnetic tunnel junction device 130 has a resistance value that changes according to a temperature. Particularly, if the magnetization directions are opposite to each other and a temperature increases, a resistance value decreases. That is, the tunnel magnet-to-resistance characteristics change according to a temperature. The tunnel magnet-to-resistance characteristics make resistance value difference of data '1' and '0' gradually smaller. Therefore, it makes a semiconductor memory device difficult to determine whether the magnetic tunnel junction device 130 sustains a small resistance value or a large resistance value. Such a problem causes a semiconductor memory device not to properly read stored data when a semiconductor memory device performs a read operation.

SUMMARY OF THE INVENTION

An embodiment of the present invention is directed to providing a semiconductor memory device that controls current flowing through a magnetic tunnel junction device when a read operation is performed to read data.

In accordance with an aspect of the present invention, there is provided a semiconductor memory cell comprising a plurality of memory cells configured to store data having polarity corresponding to a direction of current flowing in first and second driving lines, a current generator configured to generate a predetermined read current, apply the predetermined read current to the plurality of memory cells, and generate a data current corresponding variation of the read current according to the data and a current controller connected to a current path of the read current and configured to control a current amount of the read current.

In accordance with another aspect of the present invention, there is provided a semiconductor memory device comprising a plurality of memory cells configured to store data having polarity corresponding to a direction of current flowing in a source line and a bit line, a cell current generator configured to generate a predetermined read current, apply the predetermined read current to the plurality of memory cells, and generate a data current corresponding to variation of the read current according to the data, a current controller connected to a current path of the read current and configured to control a current amount of the read current according to temperature information, a plurality of reference memory cell groups configured to store reference data having polarity corresponding to a direction of current flowing in a reference source line and a reference bit line, a reference current generator configured to generate a predetermined current, apply the predetermined current to the plurality of reference memory cells, and generate a reference current corresponding to the reference data, a reference current controller configured to control current applied to the plurality of reference memory cells according to the temperature information in the reference current generator and a sense amplifier configured to sense and amplify the data current and the reference current.

The semiconductor memory device can improve the tunnel magnetic resistance characteristics of a magnetic junction device included in a semiconductor memory device by controlling a read current flowing in a magnetic tunnel junction device according to temperature during a read operation.

DESCRIPTION OF SPECIFIC EMBODIMENTS

Other objects and advantages of the present invention can be understood by the following description, and become apparent with reference to the embodiments of the present invention.

Figure 3:
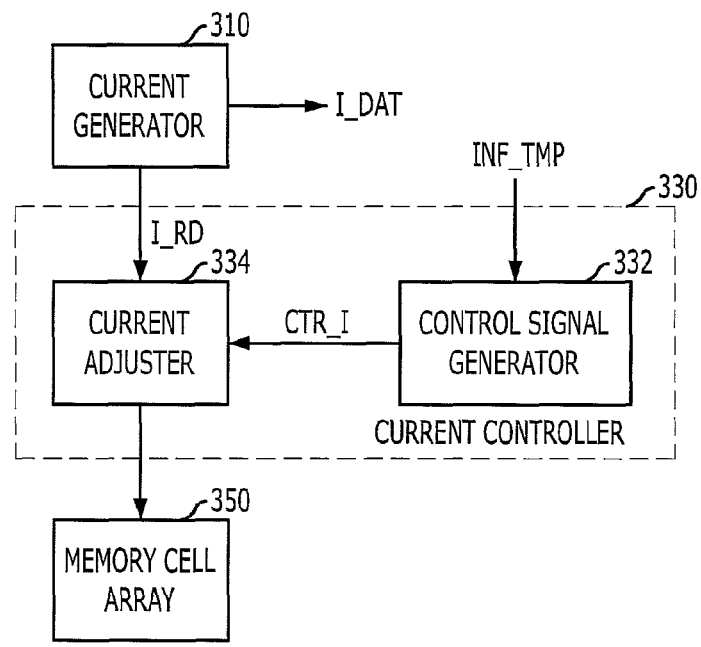
FIG. 3 is a block diagram illustrating a semiconductor memory device in accordance with an embodiment of the present invention.

FIG. 3 is a block diagram illustrating a semiconductor memory device in accordance with an embodiment of the present invention.

Referring to FIG. 3, the semiconductor memory device according to the present embodiment includes a current generator 310, a current controller 330, and a memory cell array 350.

The current generator 310 generates a read current I_RD having a predetermined size for a read operation and applies the generated read current I_RD to the memory cell array 350. The current generator 310 also generates a data current I_DAT that represents the variation of the read current I_RD according to data stored in the memory cell array 350. An amount of the data current I_DAT is decided according to data stored in the memory cell array 350. Although it will be described again in later, the semiconductor memory device compares the generated data current I_DAT with a reference current I_REF (see accompanying drawings) and determines data stored in the memory cell array 350 based on the comparison result.

The current controller 330 is connected to a current path of the read current I_RD and controls an amount of the read current I_RD applied to the memory cell array 350 according to the temperature information INF_TMP. The current controller 330 includes a control signal generator 332 for generating a current control signal CTR_I corresponding to the temperature information INF_TMP and a current adjuster 334 for adjusting an amount of current of the read current I_RD in response to the current control signal CTR_I. The temperature information INF_TMP is a signal generated inside or outside the semiconductor memory device.

The memory cell array 350 includes a magnetic tunnel junction device and stores data having a polarity corresponding to a direction of current flowing through a source line SL and a bit line in the magnetic tunnel junction device. A write operation and a read operation of the memory cell array 350 will be described with reference to FIG. 5.

Figure 4:
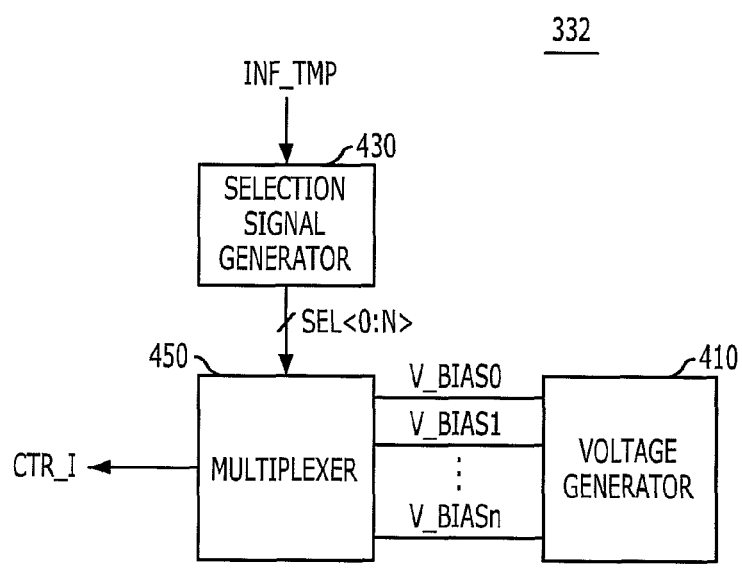
FIG. 4 is a block diagram illustrating the control signal generator 332 of FIG. 3.

FIG. 4 is a block diagram illustrating a control signal generator 332 of FIG. 3.

Referring to FIG. 4, the control signal generator 332 includes a voltage generator 410 for generating a plurality of bias voltages V_BIAS0, V_BIAS1, . . . , and V_BIASn, a selection signal generator 430 for generating a selection signal SEL<0:n> corresponding to temperature information INF_TMP, and a multiplexer 450 for outputting one of the plurality of bias voltages V_BIAS0, V_BIAS1, . . . , and V_BIASn as a current control signal CTR_I.

The plurality of bias voltages V_BIAS0, V_BIAS1, . . . , and V_BIASn have different voltage levels, and the selection signal SEL<0:n> has a different value according to the temperature information INF_TMP. The selection signal SEL<0:n> can select each of the plurality of bias voltages V_BIAS0, V_BIAS1, . . . , and V_BIASn. Finally, the control signal generator 332 can output a bias voltage corresponding to the temperature information INF_TMP as the current control signal CTR_I.

Figure 5:
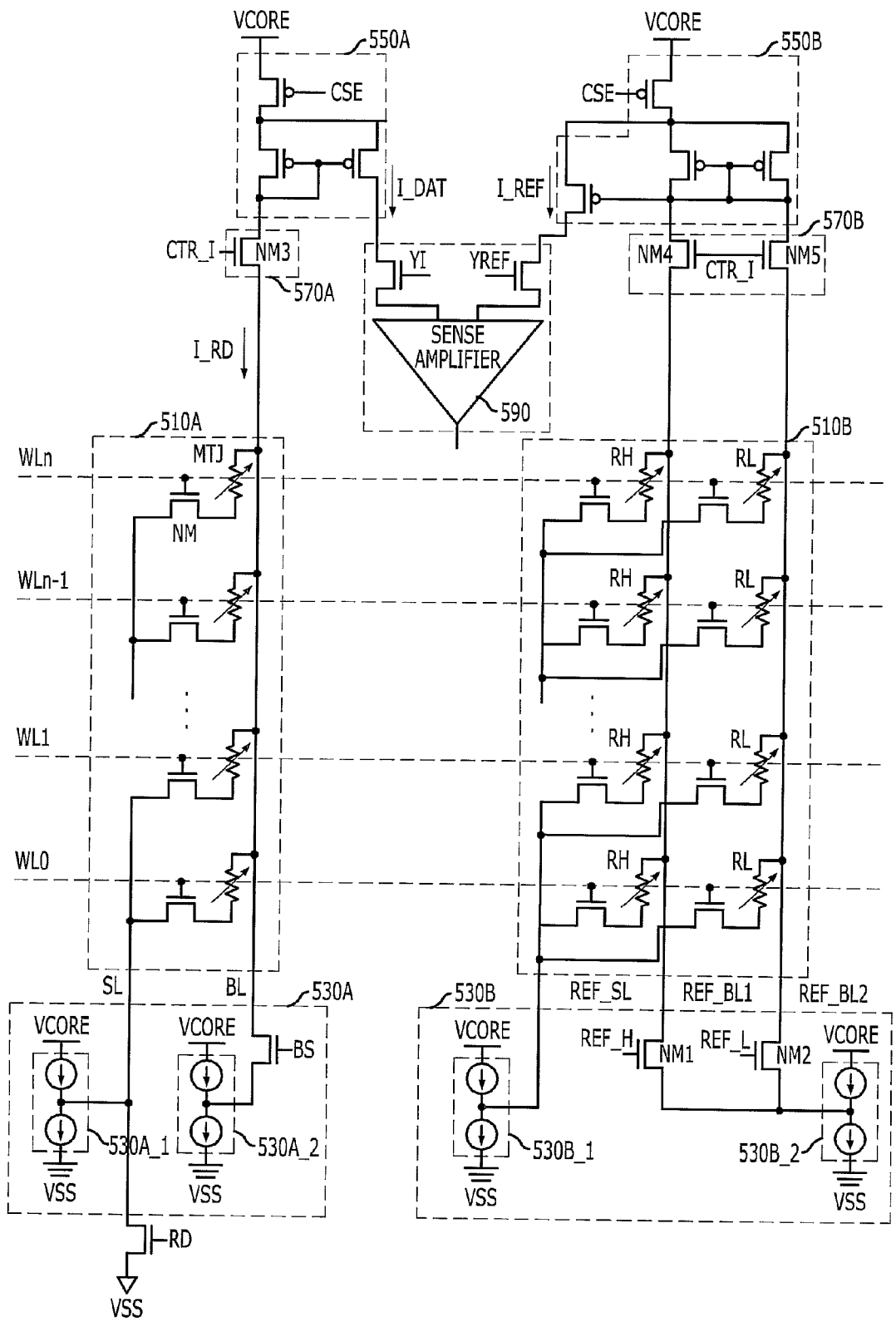
FIG. 5 is a circuit diagram illustrating predetermined blocks of FIG. 3.

FIG. 5 is a circuit diagram illustrating predetermined parts of a semiconductor memory device of FIG. 3. That is, FIG. 5 shows other constituent elements of the FIG. 3 except the control signal generator 332.

Referring to FIG. 5, the semiconductor memory device includes a plurality of memory cells 510A, a plurality of reference memory cells 510B, first and second write drivers 530A and 530B, a cell current generator 550A, a reference current generator 550B, first and second current controllers 570A and 570B, and a sense amplifier 590.

As described with reference to FIG. 3, the semiconductor memory device of FIG. 3 controls a current amount of a read current I_RD applied to a memory cell array 350 according to temperature information INF_TMP. The semiconductor memory device shown in FIG. 5 also applies such characteristics into a plurality of reference memory cells 520 as well as the plurality of memory cells 510. In other words, a current generator 310 of FIG. 3 corresponds to a cell current generator 550A and a reference current generator 550B of FIG. 5, and a current adjuster 334 of FIG. 3 corresponding to first and second current controllers 570A and 570B of FIG. 5. Further, the memory cell array 350 of FIG. 3 corresponds to a plurality of memory cells 510A and a plurality of reference memory cells 510B.

Hereinafter, constituent elements of the semiconductor memory device of FIG. 5 will be described in detail.

Figure 1:
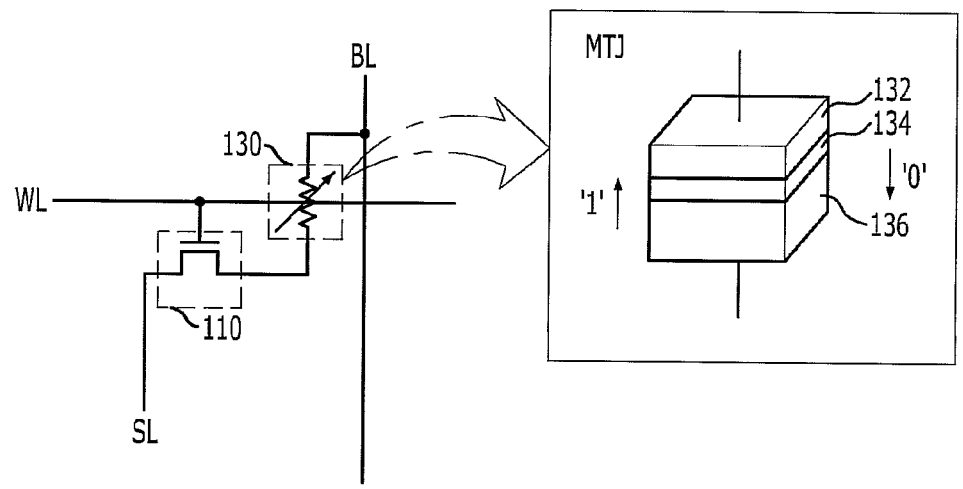
FIG. 1 is a diagram illustrating a memory cell of a semiconductor memory device according to the prior art.

The plurality of memory cells 510A store data. As described in FIG. 1, the plurality of memory cells 510A includes a NMOS transistor NM for performing a switching operation corresponding to each address and a magnetic tunnel junction device (MTJ) for storing data. Each of the plurality of memory cells 510A corresponds to each of word lines WL0, WL1, . . . , and WLn and is connected between a source line SL and a bit line BL. Write and read operations of the plurality of memory cells 510A will be described in later.

The first write driver 530A drives a source line SL and a bit line BL according to data. The first write driver 530A includes a source line driver 530A_1 and a bit line driver 530A_2.

The source line driver 530A_1 drives a source line SL with a core voltage VCORE or a ground voltage VSS in response to data. The bit line driver 530A_2 drives a bit line BL with a core voltage VCORE or a ground voltage VSS in response to data.

Hereinafter, a write operation of the plurality of memory cells 510A will be described in brief. For convenience, it is assumed that one corresponding to a memory cell performing a write operation is activated among a memory cell of the plurality of word lines WL0, WL1, . . . , and WLn. Since a bit line selection signal BS is activated during a write operation, the bit line BL may be driven by the bit line driver 530A_2.

For a write operation to write data '1', the source line driver 530A_1 drives a source line SL with a core voltage VCORE and the bit line driver 530A_2 drives a bit line BL with a ground voltage VSS. Therefore, the current flows from the source line SL to the bit line BL through a magnetic tunnel junction device and data '1' is stored in a memory cell as described in FIG. 1.

For a write operation for writing data '0', the source line driver 530A_1 drives a source line SL with a ground voltage VSS, and the bit line driver 530A_A2 drives a bit line BL with a core voltage VCORE. Therefore, current flows from the bit line BL to the source line through the magnetic tunnel junction device (MTJ) and the memory cell stores data '0'.

The plurality of reference memory cells 510B generate a reference current I_REF. The plurality of reference memory cells 510B have a similar structure of the plurality of memory cells 510A. Two reference memory cells are grouped and disposed together corresponding to one word line. For convenience, two reference memory cells corresponding to one word line are referred as a reference memory cell group.

Figure 2:
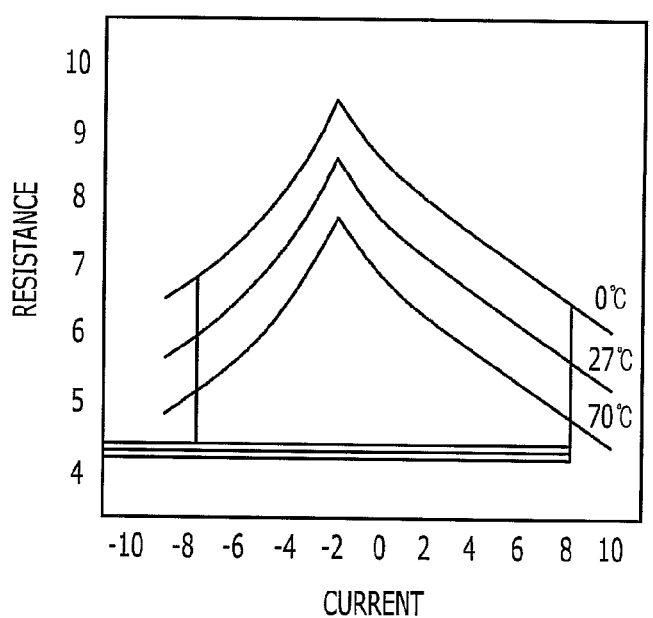
FIG. 2 is a graph showing tunnel magnet-to-resistance (TMR) characteristics according to a temperature of a magnetic tunnel junction device 130 of FIG. 1.

In general, two reference memory cells in all of reference memory cell groups should store data '1' and '0', respectively before a semiconductor memory device is completely manufactured as a product. That is, one of reference memory cells in a reference memory cell group should become a magnetic tunnel junction device RH having a large resistance value, and the other should become a magnetic tunnel junction device RL having a small resistance value. Since the magnetic tunnel junction device has a resistance value varying as shown in FIG. 2, all of reference memory cell groups should store '0' and '1' with different polarity. The plurality of reference memory cells 320 should store '0' and '1' for generating a reference current I_REF corresponding to a state of a selected memory cell in which a resistance value changes. A write operation and a read operation related to the plurality of reference memory cells 320 will be described in later.

The second write driver 530B stores data '1' and '0' into a plurality of reference memory cells 510B. The second write driver 530B includes first and second line drivers 530B_1 and 530B_2.

The first line driver 530B_1 drives a reference source line REF_SL with a core voltage VCORE or a ground voltage VSS according to data to be stored. The second line driver 530B_2 drives first and second reference bit lines REF_BL1 and REF_BL2 with a core voltage VCORE or a ground voltage VSS according to data to be stored.

Hereinafter, a write operation related a reference memory cell will be described in brief. For convenience, it is assumed that one of a plurality of word lines WL0, WL1, . . . , and WLn is activated.

When a write operation is performed to write data '1', a first driving control signal REF_H becomes logic high and a first NMOS transistor NM1 is turned on. The first line driver 530B_1 drives a reference source line REF_SL with a core voltage VCORE, and the second line driver 530B_2 drives a first reference bit line REF_BL1 with a ground voltage VSS. Therefore, current flows from the reference source line REF_SL to a first reference bit line REF_BL1 through a magnetic tunnel junction device RH. The magnetic tunnel junction device RH stores data '1'. That is, the magnetic tunnel junction device RH stores a large resistance value.

When a write operation is performed to write data '0', the second driving control signal REF_L becomes logic high and a second NMOS transistor NM2 is turned on. The first line driver 530B_1 drives the reference source line REF_SL with a ground voltage VSS, and the second line driver 530B_2 drives the second reference bit line REF_BL2 with a core voltage VCORE. Therefore, current flows from the second reference bit line REF_BL2 to the reference source line REF_SL through the magnetic tunnel junction RL. Therefore, the magnetic tunnel junction device RL stores data '0'. That is, the magnetic tunnel junction device RL has a small resistance value.

The plurality of reference memory cells 320 includes a magnetic tunnel junction device RH having a large reference value and a magnetic tunnel junction device RL having a small resistance value as described above. For example, in order to store data '1' and '0' in a reference memory cell group corresponding to one word line, one of word lines is activated, a corresponding reference memory cell is selected by the first and second driving control signal REF_H and REF_L, and the first and second line drivers 380 and 390 perform related operation. In order to store data '1' and '0' in other reference memory cell groups, the above described operations are repeated corresponding to corresponding word lines.

The cell current generator 550A generates a data current I_DAT corresponding to a memory cell selected by a plurality of word lines WL0, WL1, . . . , and WLn among a plurality of memory cells 510A. The cell current generator 550A is formed of current mirror. The cell current generator 550A generates not only the data current I_DAT but also a read current I_RD. Variation of the read current I_RD in a read operation is reflected to the data current I_DAT through the current mirror structure.

The reference current generator generates a reference current I_REF corresponding to a reference memory cell group selected by a plurality of word lines WL0, WL1, . . . , and WLn. An amount of the reference current I_REF is about half of an amount of current flowing in a selected reference memory cell group. That is, the reference current I_REF is about half of the sum of current flowing in a magnetic tunnel junction device RH having a large resistance value and a magnetic tunnel junction device RL having a small resistance value.

The cell current generator 550A and the reference current generator 550B are enabled in response to the current apply control signal CSE that is activated during a read operation.

The first current controller 570A controls an amount of current of the read current I_RD generated from the cell current generator 550A in response to the current control signal CTR_I and transfers the controlled current to the plurality of memory cells 510A. The first current controller 570A includes a source-drain path formed between the cell current generator 550A and the plurality of memory cells 510A and a third NMOS transistor NM3 for receiving a current control signal CTR_I with a gate. The current control signal CTR_I decides a voltage level according to temperature information INF_TMP. It means that the read current I_RD may be controlled according to temperature.

The second current controller 570B controls current generated from the reference current generator 550B in response to a current control signal CTR_I and transfers the controlled current to the plurality of reference memory cells 510B. The second current controller 570B includes fourth and fifth NMOS transistors NM4 and NM5 connected between the reference current generator 550B and the plurality of reference memory cells 510B. The fourth NMOS transistor NM4 includes a source-drain path between the reference current generator 550B and the first reference bit line REF_BL1 and a gate for receiving the current control signal CTR_1. The fifth NMOS transistors NM5 includes a source-drain path between the reference current generator 550B and the second reference bit line REF_BL2 and a gate for receiving a current control signal CTR_I. Like the first current controller 570A, the second current controller 570B can control current flowing to the plurality of reference memory cells 510B according to temperature.

The sense amplifier 590 senses and amplifies a data current I_DAT and a reference current I_REF. The sense amplifier 590 receives a reference current I_REF of a reference memory cell group corresponding to a selected word line and a data current I_DAT that changes according to data of a memory cell corresponding to a selected word line, compares the reference current I_REF with the data current I_DAT, and outputs the comparison result in order to enable a semiconductor memory device to determine data stored in a memory cell.

Hereinafter, a read operation of a plurality of memory cells 510A will be described in brief. For convenience, it is assumed that a first word line WL1 is activated and a read activation signal RD is also activated during a read operation.

If the first word line WL1 is activated, a NMOS transistor of a corresponding memory cell is turned on and an amount of a read current I_RD generated from the cell current generator 550A is decided according to data stored in a magnetic tunnel junction device of a corresponding memory cell. If data stored in a magnetic tunnel junction device is '1', it means the resistance value of the magnetic tunnel junction device is large and the read current I_RD becomes smaller. If data stored in a magnetic tunnel junction device is '0', it means that the resistance vale of the magnetic tunnel junction device becomes smaller and the read current I_RD becomes larger. The read current I_RD is controlled according to a voltage of a current control signal CTR_I corresponding to temperature information INF_TMP. The current amount of the read current I_RD is reflected to data current I_DAT, and the data current I_DAT is transferred to the sense amplifier 590. The cell selection signal YI is activated corresponding to a column address.

When a first word line WL1 is activated, a NMOS transistor of a corresponding reference memory cell group is turned on and current flows to a reference source lien REF_SL through a magnetic tunnel junction device RH having a large resistance value and a magnetic tunnel junction device RL having a small resistance value. Finally, current flows through the magnetic tunnel junction device RH having a large resistance value and the magnetic tunnel junction device RL arranged corresponding to a first word line. The reference current generator 570B generates a reference current I_REF having about half amount of the sum of a current amount of the magnetic tunnel junction device RH having a large resistance value and current amount of the magnetic tunnel junction device RL having a small resistance value. In the present embodiment, current applied to the plurality of reference memory cells 510B can be controlled according to a voltage of a current control signal CTR_I. The reference cell activation signal YREF is activated to transfer the reference current I_REF to the sense amplifier 590 during a read operation.

Then, the sense amplifier 590 senses and amplifies a data current I_DAT of a selected memory cell corresponding to a first word line WL1, a reference current I_REF of a selected magnetic tunnel junction device RH having a large resistance value corresponding to the first word line WL1, and a reference current I_REF of a selected magnetic tunnel junction device RL having a small resistance value corresponding to the first word line WL1. The semiconductor memory device performs a read operation through the above described operation.

The semiconductor memory device according to the present embodiment controls a current amount of a read current I_RD applied to the plurality of memory cells 510A according to temperature. Therefore, it is possible to reflect a temperature compensation operation to the read current I_RD and to further accurately determine data by controlling the current amount of the read current I_RD although the magnetic tunnel junction device has temperature characteristics shown in FIG. 2.

The semiconductor memory device according to the present embodiment controls a current amount applied to the plurality of reference memory cells 510B according to temperature. Therefore, it is possible to reflect a temperature compensating operation to a reference current I_REF.

The semiconductor memory device according to the present embodiment can perform a read operation stably although temperature changes by improving tunnel magnetic resistance characteristics according to temperature of a magnetic tunnel junction device. Therefore, the reliability of a semiconductor memory device may be improved.

While the present invention has been described with respect to the specific embodiments, it will be apparent to those skilled in the art that various changes and modifications may be made without departing from the spirit and scope of the invention as defined in the following claims.

What is claimed is:
1. A semiconductor memory cell comprising:
  a plurality of memory cells configured to store data having polarity corresponding to a direction of current flowing in first and second driving lines;
  a current generator configured to generate a predetermined read current, apply the predetermined read current to the plurality of memory cells, and generate a data current corresponding variation of the read current according to the data; and
  a current controller connected to a current path of the read current and configured to control a current amount of the read current.

2. The semiconductor memory device of claim 1, further comprising a write driver configured to drive the first and second driving lines with power corresponding the data.

3. The semiconductor memory device of claim 1, wherein the current controller includes:
  a control signal generator configured to generate a current control signal corresponding to the temperature information; and
  a current adjuster configured to adjust a current amount of the read current in response to the current control signal.

4. The semiconductor memory device of claim 3, wherein the current control signal has a voltage level corresponding to the temperature information.

5. The semiconductor memory device of claim 3, wherein the control signal generator includes:

a selection signal generator configured to generate a selection signal corresponding to the temperature information;

a voltage generator configured to generate a plurality of bias voltages; and a multiplexer configured to output one of the plurality of bias voltages as the current control signal corresponding to the selection signal.

6. The semiconductor memory device of claim 1, wherein each of the plurality of memory cells includes:

a switch configured to perform a switching operation in response to an address; and a magnetic tunnel junction device connected to the switch.

7. A semiconductor memory device, comprising:

a plurality of memory cells configured to store data having polarity corresponding to a direction of current flowing in a source line and a bit line;

a cell current generator configured to generate a predetermined read current, apply the predetermined read current to the plurality of memory cells, and generate a data current corresponding to variation of the read current according to the data;

a current controller connected to a current path of the read current and configured to control a current amount of the read current according to temperature information;

a plurality of reference memory cell groups configured to store reference data having polarity corresponding to a direction of current flowing in a reference source line and a reference bit line;

a reference current generator configured to generate a predetermined current, apply the predetermined current to the plurality of reference memory cells, and generate a reference current corresponding to the reference data;

a reference current controller configured to control current applied to the plurality of reference memory cells according to the temperature information in the reference current generator; and a sense amplifier configured to sense and amplify the data current and the reference current.

8. The semiconductor memory device of claim 7, further comprising:

a first write driver configured to drive the source line and the bit line with power corresponding the data; and a second write driver configured to drive the reference source line and the reference bit line based on power corresponding to the reference data.

9. The semiconductor memory device of claim 7, wherein each of the current controller and the reference current controller includes a current adjuster configured to adjust a current amount of a corresponding current according to the temperature information.

10. The semiconductor memory device of claim 9, further comprising a control signal generator configured to generate a current control signal corresponding to the temperature information and control the current adjuster.

11. The semiconductor memory device of claim 10, wherein the current control signal has a voltage level corresponding to the temperature information.

12. The semiconductor memory device of claim 10, wherein the control signal generator includes:

a selection signal generator configured to generate a selection signal corresponding to the temperature information;

a voltage generator configured to generate a plurality of bias voltages; and a multiplexer configured to output one of the plurality of bias voltages corresponding to the selection signal.

13. The semiconductor memory device of claim 7, wherein each of the plurality of memory cells includes:

a switch configured to perform a switching operation in response to an address; and a magnetic tunnel junction device connected to the switch.

14. The semiconductor memory device of claim 7, wherein each of the plurality of reference memory cell groups includes:

first and second switches configured to perform a switching operation in response to an address; and first and second magnetic tunnel junction devices connected to the first and second switches respectively.

15. The semiconductor memory device of claim 14, wherein the first and second magnetic tunnel junction devices store data having different polarities.

* * * * *